United States Patent [19]
Bothra

[11] Patent Number: 5,981,378
[45] Date of Patent: Nov. 9, 1999

[54] RELIABLE INTERCONNECT VIA STRUCTURES AND METHODS FOR MAKING THE SAME

[75] Inventor: Subhas Bothra, San Jose, Calif.

[73] Assignee: VLSI Technology, Inc., San Jose, Calif.

[21] Appl. No.: 08/900,501

[22] Filed: Jul. 25, 1997

[51] Int. Cl.⁶ .............................................. H01L 21/4763
[52] U.S. Cl. .......................... 438/637; 438/627; 438/633; 438/688; 438/692; 438/622; 438/927
[58] Field of Search .................................. 438/927, 627, 438/637, 633, 688, 692, 622

[56] References Cited

U.S. PATENT DOCUMENTS

| | | | |
|---|---|---|---|
| 4,782,380 | 11/1988 | Shankar et al. | 357/71 |
| 5,141,897 | 8/1992 | Manocha et al. | 437/228 |
| 5,272,101 | 12/1993 | Forouhi et al. | 437/50 |
| 5,305,519 | 4/1994 | Yamamoto et al. | 29/852 |
| 5,332,684 | 7/1994 | Yamamichi et al. | 437/52 |
| 5,451,551 | 9/1995 | Krishnan et al. | 437/241 |
| 5,462,892 | 10/1995 | Gabriel | 437/189 |
| 5,627,101 | 5/1997 | Lin et al. | 438/18 |
| 5,670,420 | 9/1997 | Choi | 437/189 |

*Primary Examiner*—John F. Niebling
*Assistant Examiner*—David A. Zarneke
*Attorney, Agent, or Firm*—Hickman & Martine, LLP

[57] ABSTRACT

Disclosed is an aluminum filled via hole for use in a semiconductor interconnect structure. The aluminum filled via hole of the semiconductor interconnect structure includes a first patterned metallization layer lying over a first dielectric layer. A second dielectric layer overlying the first patterned metallization layer and the first dielectric layer. An aluminum filled via hole defined through the second dielectric layer and in contact with the first patterned metallization layer. The aluminum filled via hole has an electromigration barrier cap over a topmost portion of the aluminum filled via hole that is substantially level with the second dielectric layer. The electromigration barrier cap having a thickness of between about 500 angstroms and about 2,500 angstroms.

7 Claims, 6 Drawing Sheets

RELIABLE INTERCONNECT VIA STRUCTURES AND METHODS FOR MAKING THE SAME

BACKGROUND OF THE INVENTION

1. Field of the Invention

The present invention relates generally to semiconductor circuits and, more particularly, to reliable interconnect via structures and methods for making the same.

2. Description of the Related Art

Interconnect structures of integrated circuits (ICs) generally take the form of patterned metallization lines that are used to electrically interconnect devices and to provide interconnection with external circuitry. By way of example, IC devices may include metal oxide semiconductor ("MOS") devices having diffused source and drain regions separated by channel regions, and gates located over the channel regions. In practice, an IC chip may include thousands or millions of devices, such as MOS transistors.

Conventionally, a dielectric layer (e.g., silicon oxide) is deposited over the devices, and via holes are patterned and formed through the dielectric layer to the devices below. As is well known in the art, photolithography "patterning" is typically accomplished by depositing a photoresist layer over the dielectric layer, selectively exposing the photoresist to light through a patterned reticle having via hole patterns, developing the photoresist to form a resist via mask, and etching the exposed dielectric layer to form via holes leading to a lower level. Once the via holes are formed, a conductive material such as tungsten is used to fill the via holes to define what are known as "W" tungsten plugs. Once the tungsten plugs are formed, a metallization layer is formed over the dielectric layer and the tungsten plugs. The metallization layer is then patterned using conventional photolithography techniques to define a first level of interconnect metal routing. This process may then be repeated if additional layers of metallization lines are desired.

Recently, to reduce via resistance and increase device speeds, designers have been filling the via holes with aluminum "Al", and using low "K" dielectric materials for the intermnetal dielectric layers. The aluminum filled via holes (i.e., aluminum plugs) and the low "K" dielectric materials have been successful in decreasing resistance in interconnect structures, but a substantial amount of aluminum atoms within the aluminum plugs have been found to migrate along with the flow of electrons. This electron flow therefore causes the formation of voids in the interconnect lines as well as in the aluminum plugs.

To illustrate this problem, FIG. 1 shows a cross-section of a semiconductor substrate 10 having a plurality of conventionally fabricated layers. The semiconductor substrate 10 may include diffusion regions 12 and a polysilicon gate 14 formed over the semiconductor substrate 10. A first dielectric layer 19 is formed over the semiconductor substrate 10 and is then planarized. Once planarized, via holes are formed through the first dielectric layer 19, and an aluminum plug 16 is defined after a chemical vapor deposition (CVD) aluminum deposition. Next, a metallization layer is deposited and patterned over the first dielectric layer to define a first level of interconnect lines 24. The process is again repeated to form a second dielectric layer 22, aluminum plugs 18a and 18b, and a second level of interconnect lines 26

Once the structure is complete, current "I" may be passed through the interconnect structure formed by the first and second levels of interconnect lines 24 and 26, and the aluminum plugs 18a and 18b. Therefore, when current flows that are typical in interconnect buses, power lines "Vdd" and ground lines "Vss" are passed through this low resistive structure, the electron flow "e" may unfortunately cause voids 32 in the aluminum plug 18a and voids 30 and 30' in the interconnect lines 24 and 26, respectively. It is believed that the voids 32 in the aluminum plug 18a is partially due to the fact that less aluminum material is contained within the via holes as compared to the interconnect line itself. By way of example, a typical aluminum plug may contain a volume of about 0.75 microns$^3$ of aluminum, while a typical metallization interconnect line lying over an aluminum plug may contain a volume of about 3.2 microns$^3$.

Accordingly, when the current flow begins to cause electromigration of aluminum atoms in the interconnect structure of FIG. 1, an "open circuit" failure will necessarily tend to occur much more rapidly within the aluminum plug 18a. In practice, given the above exemplary aluminum plug and interconnect volumes, aluminum plugs may cause device failures within about 1 to 2 years of use, while the electromigration in the interconnect line may not cause a device failure for more than about 10 years. However, a device is only as reliable as its weakest link, and therefore, even though the interconnect lines can withstand more severe voids due to electromigration, the aluminum plugs will unfortunately cause the entire device to fail at a much faster rate, thereby producing a less reliable device.

Another interconnect problem that has recently caused designers substantial difficulties is accidental over-etching of aluminum plugs when a misalignment occurs in the photolithography process. As shown in FIG. 1, when the metallization layer that is patterned to form the second interconnect layer 26 is misaligned, the underlying aluminum plug 18a is left exposed to the etching steps that are used to pattern the second interconnect layer 26. Because the aluminum plug 18a is essentially the same type of aluminum-based material used for the second interconnect layers 26, the etching chemistries used will also attack the aluminum plug 18a. When this happens, a gap 40 is may be etched into the aluminum plug 18a, which may enable process chemicals and moisture to be trapped therein. Of course, when chemicals or moisture are trapped within gap 40, aluminum plug failures may arise due to corrosion and vapor energy releasing explosions during subsequent high temperature operations. For more information on vapor energy releasing explosions, reference may be made to a commonly assigned U.S. patent application Ser. No. 08/856, 949, filed on May 15, 1997 and having inventors Subhas Bothra and Ling Q. Qian. This application is incorporated by reference herein.

Accordingly, in view of the foregoing, there is a need for a highly reliable aluminum plug technology that assists in decreasing interconnect resistance while preventing aluminum plug failing voids. Further yet, there is a need for an aluminum plug technology that prevents destructive gaps in the aluminum plugs due to photolithography misaligrnents.

SUMMARY OF THE INVENTION

Broadly speaking, the present invention fills these needs by providing highly reliable aluminum plugs for high speed interconnect structures that prevent aluminum atoms from migrating out of the via holes and thereby causing device damaging short circuit voids. It should be appreciated that the present invention can be implemented in numerous ways, including as a process, an apparatus, a system, a device, or a method. Several inventive embodiments of the present invention are described below.

In one embodiment, a method for making a semiconductor interconnect structure is disclosed. The semiconductor interconnect structure includes a semiconductor substrate having an overlying first low K dielectric material. The first low K dielectric material supports a patterned first level of metallization, and a second low K dielectric material overlies the first low K dielectric material and the patterned first level of metallization. The method includes forming at least one via hole through the second low K dielectric material down to the patterned first level of metallization. Depositing a seed layer over the second low K dielectric material and in the at least one via hole. Depositing an aluminum layer over the seed layer that overlies the second low K dielectric material and the at least one via hole such that the at least one via hole is an aluminum filled via hole. Removing the aluminum layer and the seed layer overlying the second low K dielectric material using a chemical mechanical polishing operation that is configured to remove a top portion of the aluminum filled via bole. The removed portion defining a recessed gap of between about 500 angstroms and about 2,500 angstroms at the top portion of the aluminum filled via hole. The method further comprises depositing an electromigration barrier cap within the recessed gap of the aluminum filled via hole to prevent aluminum atoms from electromigrating out of the aluminum filled via hole during operation.

In another embodiment, an aluminum filled via hole for use in a semiconductor interconnect structure is disclosed. The aluminum filled via hole of the semiconductor interconnect structure includes a first patterned metallization layer lying over a first dielectric layer. A second dielectric layer overlying the first patterned metallization layer and the first dielectric layer. An aluminum filled via hole defined through the second dielectric layer and in contact with the first patterned metallization layer. The aluminum filled via hole has an electromigration barrier cap over a topmost portion of the aluminum filled via hole that is substantially level with the second dielectric layer. The electromigration barrier cap having a thickness of between about 500 angstroms and about 2,500 angstroms.

In yet another embodiment, a system for fabricating a semiconductor interconnect structure having a semiconductor substrate means is disclosed. The semiconductor interconnect structure includes a first dielectric material that overlies the semiconductor substrate means. The first dielectric material supports a patterned first level of metallization, and a second dielectric material overlies the first dielectric material and the patterned first level of metallization. The system for fabricating includes means for forming at least one via hole through the second dielectric material down to the patterned first level of metallization. Means for depositing a seed layer over the second dielectric material and in the at least one via hole. Means for depositing an aluminum layer over the seed layer that overlies the second dielectric material and the at least one via hole, such that the at least one via hole is an aluminum filled via hole. Means for removing the aluminum layer and the seed layer overlying the second dielectric material such that a top portion of the aluminum filled via hole is removed. The removed top portion defining a recessed gap of between about 500 angstroms and about 2,500 angstroms at the top portion of the aluminum filled via hole. The system further including means for depositing an electromigration barrier cap within the recessed gap of the aluminum filled via hole to prevent aluminum atoms from electromigrating out of the aluminum filled via hole during current conduction flows.

Advantageously, the electromigration barrier cap of the aluminum filled via holes substantially prevent the migration of aluminum atoms out of the via holes. When this electromigration flow is prevented, the aluminum volume contained in the via holes will not migrate out leaving short circuit causing voids. Further, the electromigration barrier cap is well suited to act as an etch-stop that prevents over etching into the aluminum filled via holes when photolithography misalignments occur in the metallization interconnect patterning. By preventing this over etching, no gaps are defined into the aluminum filled via holes, which therefore prevents moisture and process chemicals from being trapped in the over etched gaps. In sum, the aluminum filled via holes having the electromigration barrier caps substantially improves an interconnect structure's resiliency and reliability. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for highly reliable aluminum plugs for high speed interconnect structures that prevent aluminum atoms from migrating out of the via holes and thereby causing device damaging short circuit voids is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2:
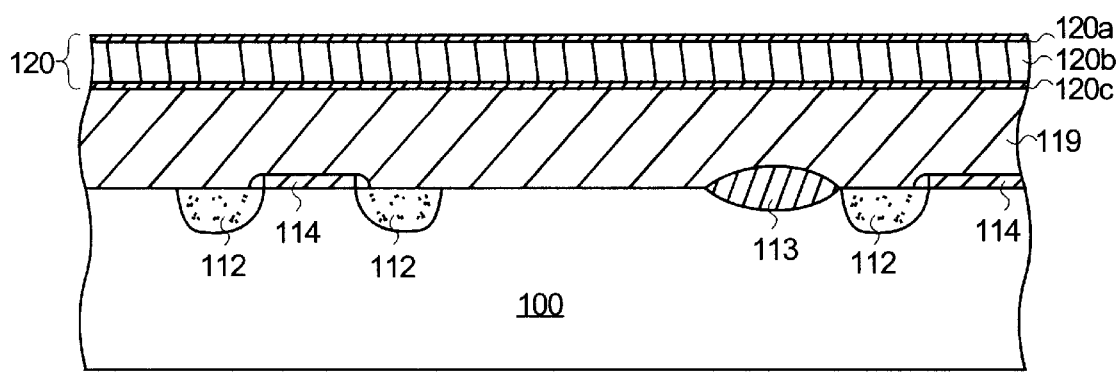
FIG. 2 is a cross-sectional view of a semiconductor substrate having a number of active devices and fabricated layers in accordance with one embodiment of the present invention.

FIG. 2 is a cross-sectional view of a semiconductor substrate 100 having a number of active devices and fabricated layers in accordance with one embodiment of the present invention. As shown, the semiconductor substrate 100 has diffusion regions 112 formed into the semiconductor substrate 100 and associated polysilicon gates 114. Also shown is a field oxide 113 typically implemented to separate adjacent active devices in a semiconductor design. A first dielectric layer 119 is deposited over portions of the semiconductor substrate 100, diffusion regions 112, polysilicon gates 114, and field oxide 113. Preferably, first dielectric layer 119 is a low "K" dielectric material having a "K" value of between about 2.0 and 4.0, and more preferably between about 2.5 and about 3.5, and most preferably about 3.0.

One exemplary low "K" dielectric material is a spin-on-glass (SOG) which may be obtained from HSG Group of Hitachi Corporation, Japan. Other exemplary low "K" dielectric materials may include a Fox-15™ flowable oxide made available by Dow Coming Corporation, of Auburn, Mich., and T-10™ hydrogen silicate glass made available by Tokyo Ohka Kogyo Co. Ltd., of Tokyo, Japan. Once deposited, the first dielectric layer 119 is planarized to provide a substantially even top surface for subsequently deposited layers. By way of example, the first dielectric layer 119 may be planarized using a chemical mechanical polishing (CMP) technique, or any other suitable technique suitable to provide a substantially planer top surface.

Once planarized, a bottom barrier layer 120c is deposited over the first dielectric layer 119 to a preferred thickness of between about 100 angstroms and about 800 angstroms. More preferably, the bottom barrier layer 120c is deposited to a thickness of between about 150 angstroms and 500 angstroms, and most preferably to a thickness of about 200 angstroms. In this embodiment, the bottom barrier layer 120c is a titanium nitride (TiN) layer evenly deposited over the top surface of the first dielectric layer 119. Of course, other suitable barrier layers may be used as well, such as titanium (Ti), or a titanium/titanium nitride (Ti/TiN) combination.

Once the bottom barrier layer 120c has been deposited, an interconnect metallization layer 120b, which is preferably an aluminum/copper (Al/Cu) mixture containing about 99.5% aluminum and about 0.5% copper is deposited over the bottom barrier layer 120c. The interconnect metallization layer 120b is preferably deposited to a thickness of between about 3,000 angstroms and about 10,000 angstroms, and more preferably between about 4,000 angstroms and 7,000 angstroms, and most preferably about 5,000 angstroms.

Next, a top barrier layer 120a, which is preferably titanium nitride (TiN) having a thickness of between about 100 angstroms and 800 angstroms, and more preferably between about 150 angstroms and 600 angstroms, and more preferably about 300 angstroms is applied over the interconnect metallization layer 120b. The top barrier layer 120a may also be a combination of titanium and titanium nitride (Ti/TiN). Further, the top barrier layer 120a is a good anti-reflective layer (ARC) material that assists in improving photolithography patterning precision. As will be described below, layers 120a, 120b, and 120c will be subsequently patterned to form a first level of metallization interconnect lines 120, that may be used to interconnect devices formed in semiconductor substrate 100. Although conductive vias may be formed down to the polysilicon gates 114 and diffusion regions 112, these conductive vias are not shown here for ease of description.

Figure 3:
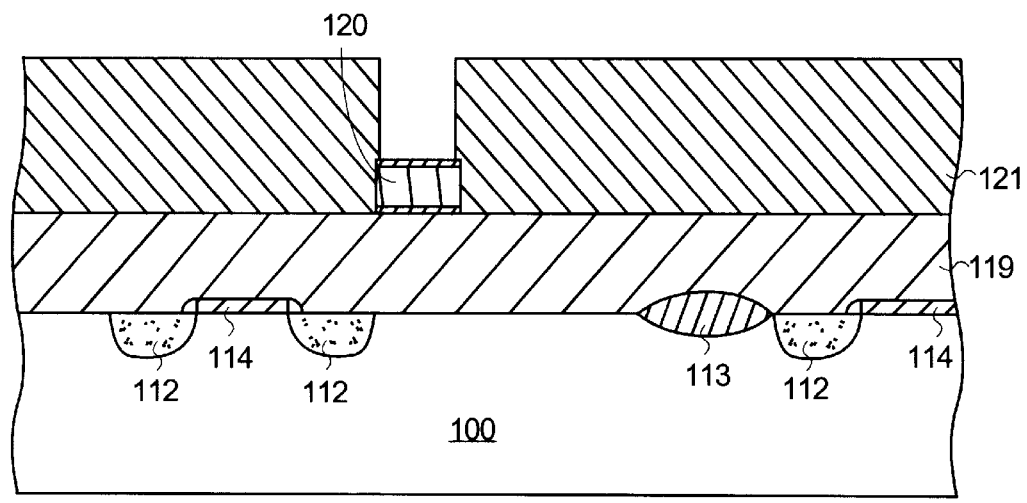
FIG. 3 shows the cross-sectional view of FIG. 2 after a first level of metallization interconnect lines are patterned, and a second dielectric layer is deposited in accordance with one embodiment of the present invention.

FIG. 3 shows the cross-sectional view of FIG. 2 after the first level metallization interconnect line 120 has been patterned, and a second dielectric layer 121 has been deposited over the first dielectric layer 119 and the interconnect line 120 in accordance with one embodiment of the present invention. To maintain the attributes of a high speed interconnect structure, the second dielectric layer 121 is also preferably selected from the same low "K" dielectrics as was the first dielectric layer 119. As shown, a via hole is then defined through the second dielectric layer 121 down to the interconnect line 120 using conventional photolithography patterning and etching. The second dielectric layer 121 preferably has a thickness of between about 4,000 angstroms and about 13,000 angstroms, and more preferably between about 5,000 angstroms and about 10,000 angstroms, and most preferably about 7,000 angstroms.

Figure 4:
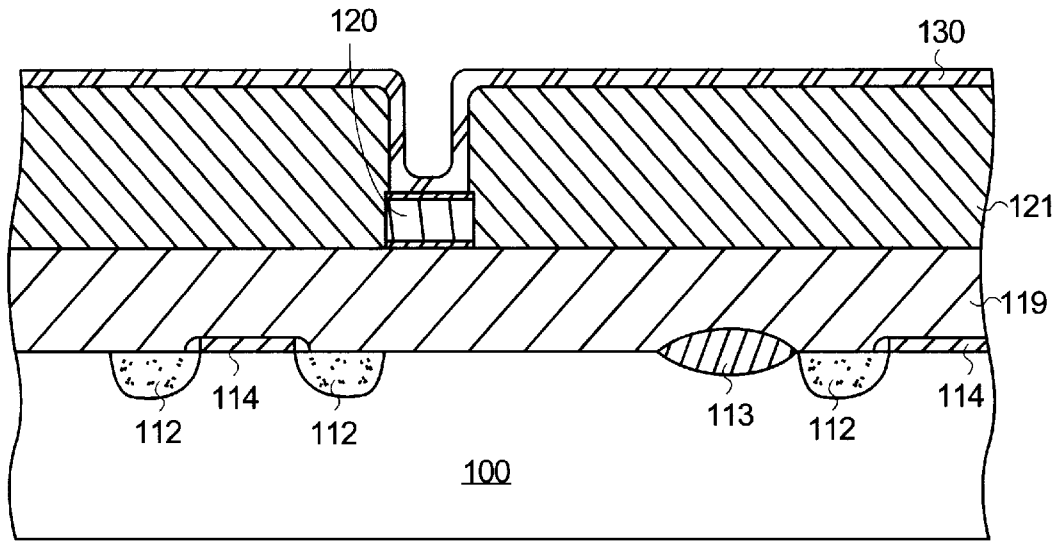
FIG. 4 shows the cross sectional view of FIG. 3 after a seed layer for a subsequent aluminum fill is deposited over the second dielectric layer in accordance with one embodiment of the present invention.

FIG. 4 shows the cross sectional view of FIG. 3 after a seed layer 130 for a subsequent aluminum fill is deposited over the second dielectric layer 121 in accordance with one embodiment of the present invention. The seed layer 130 is preferably a titanium/titanium nitride (Ti/TiN) layer deposited to a thickness of between about 100 angstroms and about 1000 angstroms, and more preferably between about 200 angstroms and 700 angstroms, and most preferably about 300 angstroms. Generally, the seed layer 130 is good underlayer for a subsequent chemical vapor deposition (CVD) of aluminum.

Figure 5:
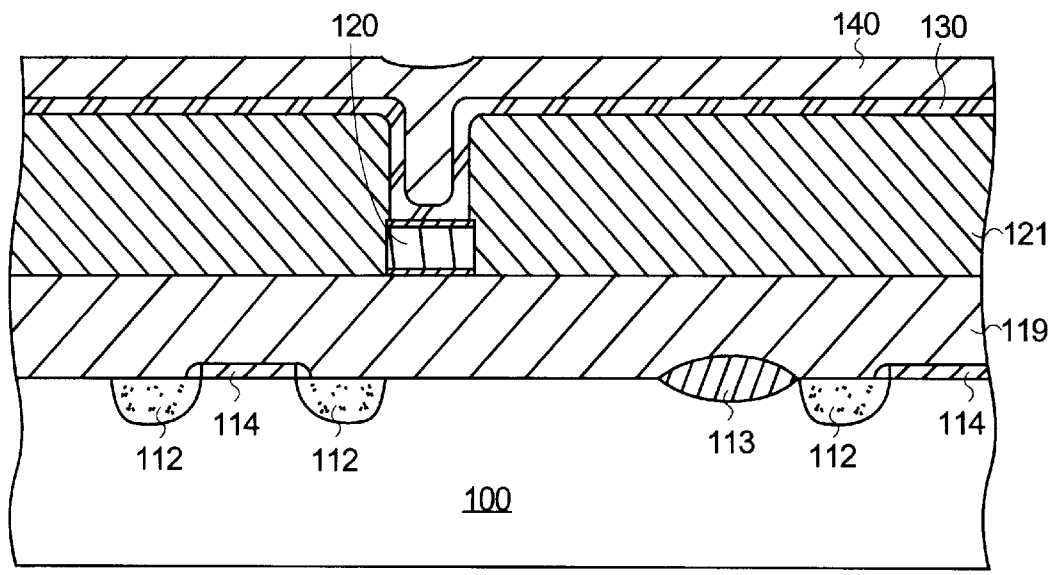
FIG. 5 shows the cross-sectional view of FIG. 4 after an aluminum metallization fill is deposited over the seed layer in accordance with one embodiment of the present invention.
Figure 6:
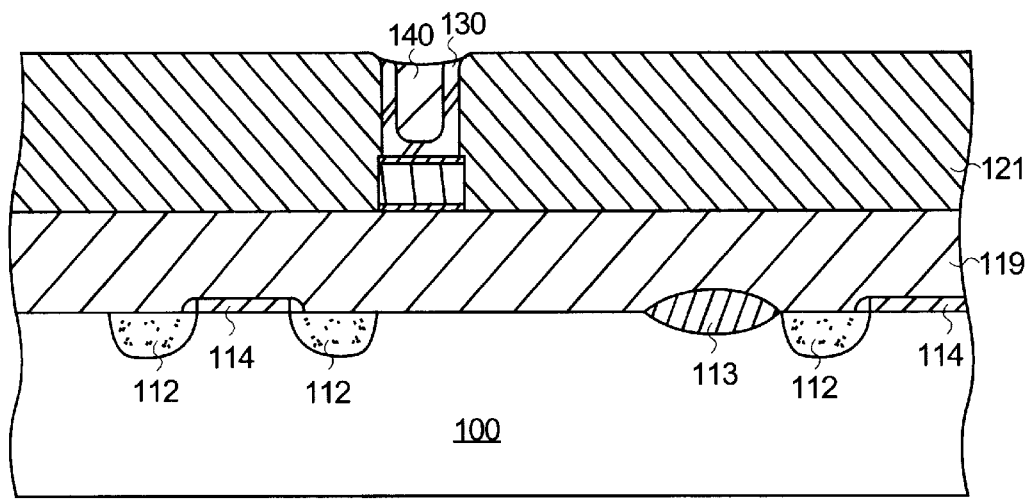
FIG. 6 shows the cross-sectional view of FIG. 5 after a chemical mechanical polish is performed to remove the aluminum metallization fill and seed layer lying over the second dielectric layer in accordance with one embodiment of the present invention.

Once the seed layer 130 has been deposited to an appropriate thickness, a CVD aluminum deposition is performed to leave an aluminum layer 140 having a thickness of between about 2,500 and about 12,000 angstroms as shown in FIG. 5. Preferably, the aluminum layer 140 is just thick enough to adequately fill all via holes throughout an integrated circuit design. FIG. 6 shows the resulting cross-sectional view of FIG. 5 after a chemical mechanical polishing (CMP) has been performed. In this operation, the CMP operation preferably includes a number of chemicals that are well suited to chemically etch the aluminum layer 140 "within the via holes" after all of the aluminum layer 140 and seed layer 130 have been removed from over the top surface of the second dielectric layer 121. By way of example, the active CMP components include slurries that contain fumed alumina particles and deionized water. In one embodiment, slurries contain about 3.4 wt. % fumed alumina particles having a median particle size of about 220 nm. In still a further embodiment, the preferred slurry is diluted with an oxidant ($H_2O_2$) at a ratio of about 3 parts slurry to 1 part of 30 wt. % $H_2O_2$. Although any number of slurries may work, one exemplary slurry is a QCTT1010 slurry that is available from M. A. Fury, Rodel, Newark, Del. For more information on CMP techniques, reference may be made to an article by J. Hernandez, et al., entitled "Mechanistic Studies of Chemical-Mechanical Polishing of Al Films," CMP-MIC Conference (February 1997). This article is incorporated herein by reference.

In one embodiment, this recipe enables the formation of a recess gap 145 which will subsequently be filled with a electromigration barrier material as shown in FIG. 6. In this embodiment, the recess gap 145 is preferably between about 500 angstroms and about 2,500 angstroms, and more preferably between about 1,000 angstroms and about 2,000 angstroms, and most preferably about 1,500 angstroms.

Figure 7:
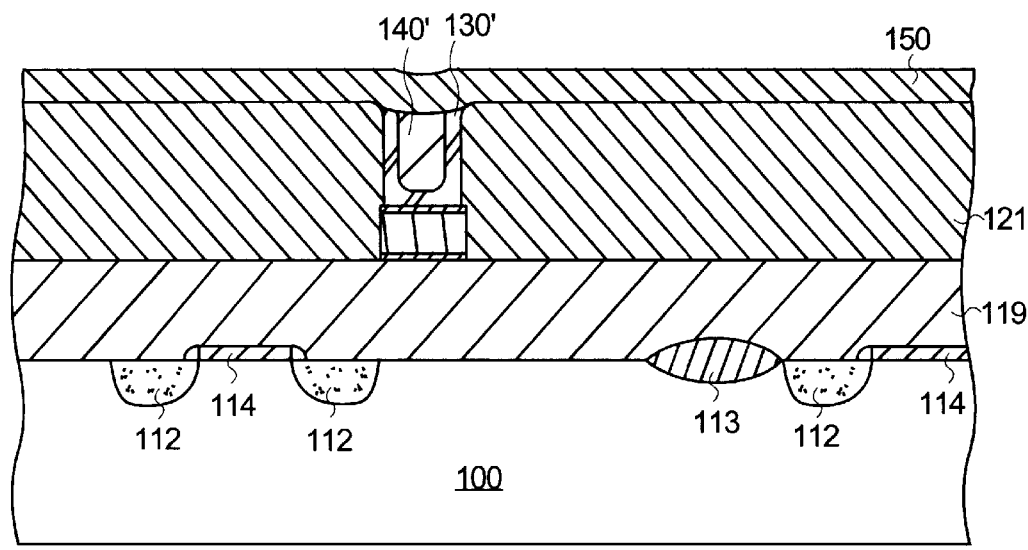
FIG. 7 is the cross-sectional view of FIG. 6 after a electromigration barrier layer is deposited over the second dielectric layer and in a recess gap in accordance with one embodiment of the present invention.

FIG. 7 is the cross-sectional view of FIG. 6 after an electromigration barrier layer 150 is deposited over the second dielectric layer 121 and within the recess gap 145 in accordance with one embodiment of the present invention. The electromigration barrier layer 150 is preferably a titanium tungsten (TiW), a tungsten (W), or a tungsten silicide (WSi$_2$) layer deposited using a sputtering process (or CVD process) to a thickness of between about 1000 angstroms and about 3000 angstroms, and more preferably between about 1,500 angstroms and about 2,500 angstroms, and most preferably about 2,000 angstroms. Most importantly, the electromigration barrier layer 150 should be thick enough to fill the recess gap 145 that is on top of the aluminum plug 140' to at least the level of the second dielectric layer 121.

Figure 8:
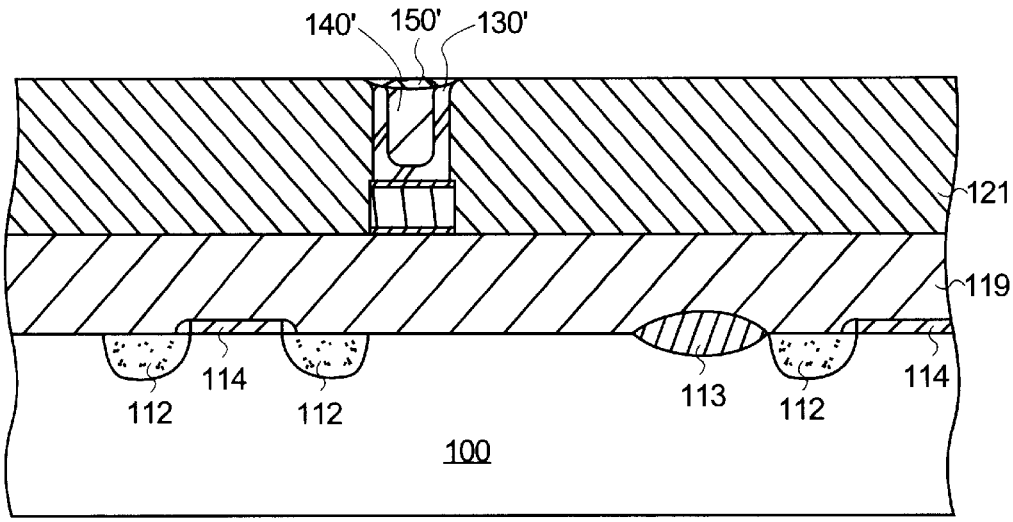
FIG. 8 is the cross-section view of FIG. 7 after a chemical mechanical polishing operation performed to remove the electromigration barrier layer in accordance with one embodiment of the present invention.

Next, the diffusion barrier layer 150 is removed using a second chemical mechanical polishing (CMP) operation as shown in FIG. 8. In this embodiment, the CMP operation is optimized such that the mechanical component performs a greater degree of the removal process. It should be understood that the CMP operation of FIG. 8 is contrary to that of the CMP operation discussed with reference to FIG. 6, which is optimized such that the chemical component performs a greater degree of the removal process. Once the CMP operation of FIG. 8 is complete, an electromigration barrier cap 150' will remain over the aluminum plug 140'. It should be noted that the electromigration barrier cap 150' is advantageously well suited to prevent the electromigration of aluminum atoms which may cause the formation of voids in the aluminum plugs 140'. More specifically, the electromigration barrier cap 150' will effectively block the flow of aluminum atoms out of the aluminum plug 140' when a strong current flow common in power and ground buses occurs.

Figure 9:
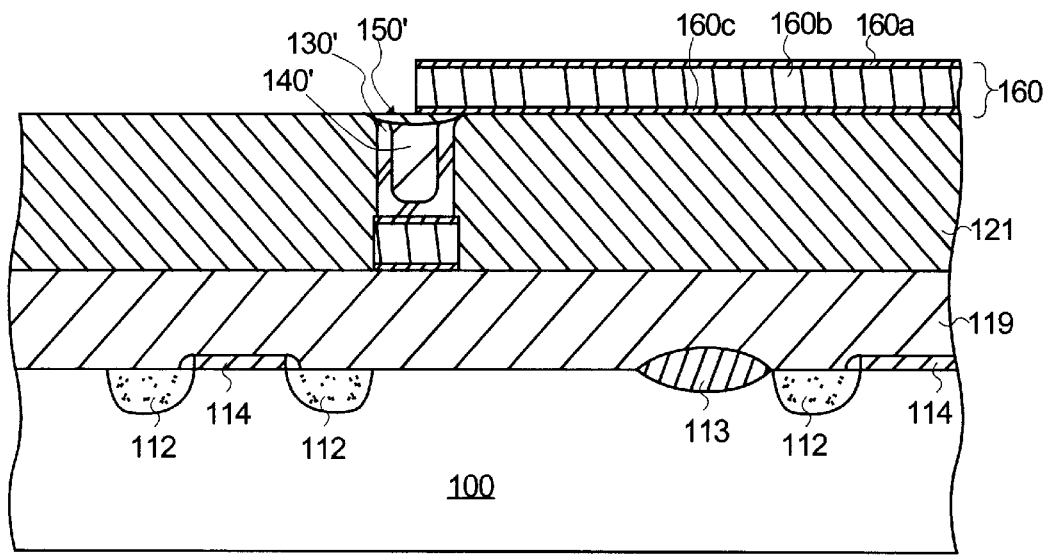
FIG. 9 shows the cross-sectional view of FIG. 8 after a metallization layer is formed and patterned to define interconnect lines in accordance with one embodiment of the present invention.

FIG. 9 shows the cross-sectional view of FIG. 8 after metallization layer 160 is formed and patterned to define interconnect lines in accordance with one embodiment of the present invention. As shown, the patterned metallization layer 160 is preferably designed to electrically interconnect with the aluminum plug 140' having the electromigration barrier cap 150'. The metallization layer 160 includes a bottom barrier layer 160c having a thickness of between about 150 angstroms and 500 angstroms, and most preferably a thickness of about 200 angstroms. In this embodiment, the bottom barrier layer 160c is a titanium nitride (TiN) layer evenly deposited over the top surface of the second dielectric layer 121. Of course, other suitable barrier layers may be used as well, such as titanium (Ti), or a titanium/titanium nitride (Ti/TiN) combination.

Next, an interconnect metallization 160b, which is an aluminum/copper (Al/Cu) mixture similar to that of interconnect metallization layer 120b, is deposited over the bottom barrier layer 160c. Preferably, the interconnect metallization 160b is deposited to a thickness of between about 3,000 angstroms and about 10,000 angstroms, and more preferably between about 4,000 angstroms and 7,000 angstroms, and most preferably about 5,000 angstroms.

Once the interconnect metallization 160b has been deposited to an appropriate thickness, a top barrier layer 160a, that is a titanium nitride (TiN) layer is deposited to a thickness of between about 100 angstroms and about 800 angstroms, and most preferably between about 150 angstroms and about 600 angstroms, and most preferably about 300 angstroms. In this embodiment, top barrier layer 160a is similar to that of top barrier layer 120a, which may also be a combination of titanium and titanium nitride (Ti/TiN). As mentioned above, the top barrier layer 160a is a good anti-reflective layer (ARC) material that assists in improving photolithography patterning operations.

Figure 1:
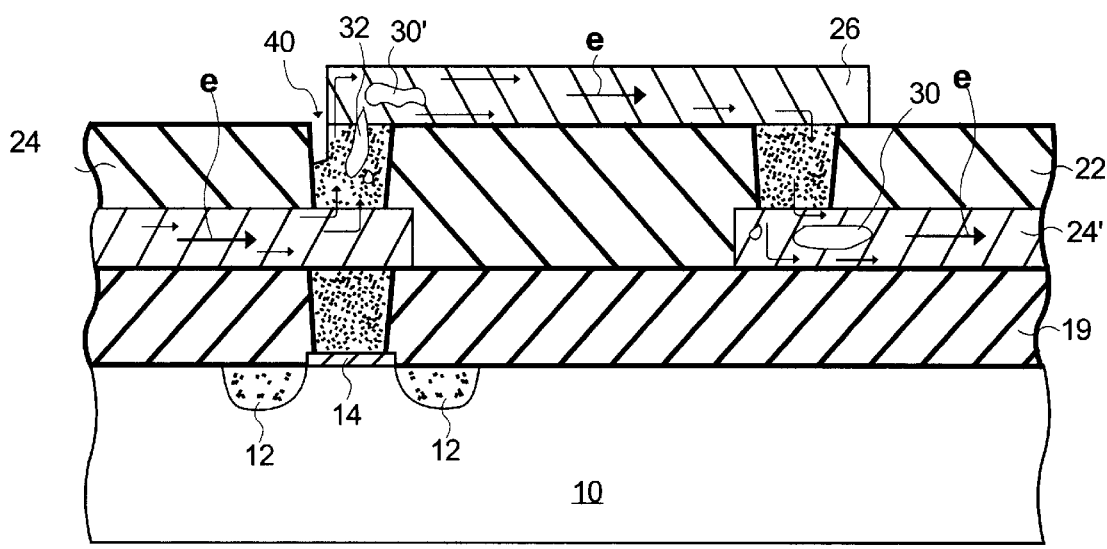
FIG. 1 is a cross-section of a semiconductor substrate having a plurality of conventionally fabricated layers that illustrate a number of reliability reducing voids.

Although the photolithography process used to pattern the metallization layer 160 did not completely overlap the aluminum plug 140' due to expected and commonly occurring misalignments, the electromigration barrier cap 150' will effectively block (i.e., act as an etch-stop) the plasma etch used to pattern the metallization layer 160 from forming the gap 40 of FIG. 1. This is because the plasma etch of Table A used to pattern metallization layer 160 is a Cl$_2$/BCL$_3$ etch chemistry that does not etch titanium tungsten (TiW), tungsten (W), or tungsten silicide (WSi$_2$) well.

TABLE A

| Exemplary Etch Chemistry A | Cl$_2$/BCL$_3$ | | | | | |
|---|---|---|---|---|---|---|
| | Top Power (watts) | Bottom Power (watts) | Flow Rate | | Pressure | Temp |
| Approximate Range | 250 to 700 | 50 to 300 | 30–90 sccms Cl$_2$ | 10–60 sccms BCL$_3$ | 5 mTorr– 40 mTorr | 20° C. to 90° C. |
| Approximate Preferred Range | 350 to 550 | 100 to 250 | 40–80 sccms Cl$_2$ | 20–40 sccms BCL$_3$ | 10 mTorr– 30 mTorr | 30° C. to 70° C. |
| Approximate More Preferred Range | 450 | 175 | 60 sccms Cl$_2$ | 30 sccms BCL$_3$ | 20 mTorr | 50° C. |

Tables A illustrates the exemplary parameters used in performing a plasma chamber etching operation in accordance with one embodiment of the present invention. Although any type of plasma etcher may be used, preferred etchers may be obtained from Lam Research Corporation of Fremont, Calif. In a specific example, a LAM Research 9600 SE may be used to perform the etching operations of Table A. Further, although the following parameters are associated with an exemplary "6 inch wafer," the parameters may be modified for application to substrates of varying sizes and shapes, such as those employed in the manufacture of semiconductor devices. Further yet, it should be understood that the highly resilient aluminum filled vias described herein may be fabricated in 0.35, 0.25, 0.18, 0.15 and smaller micron technology processes.

Figure 10:
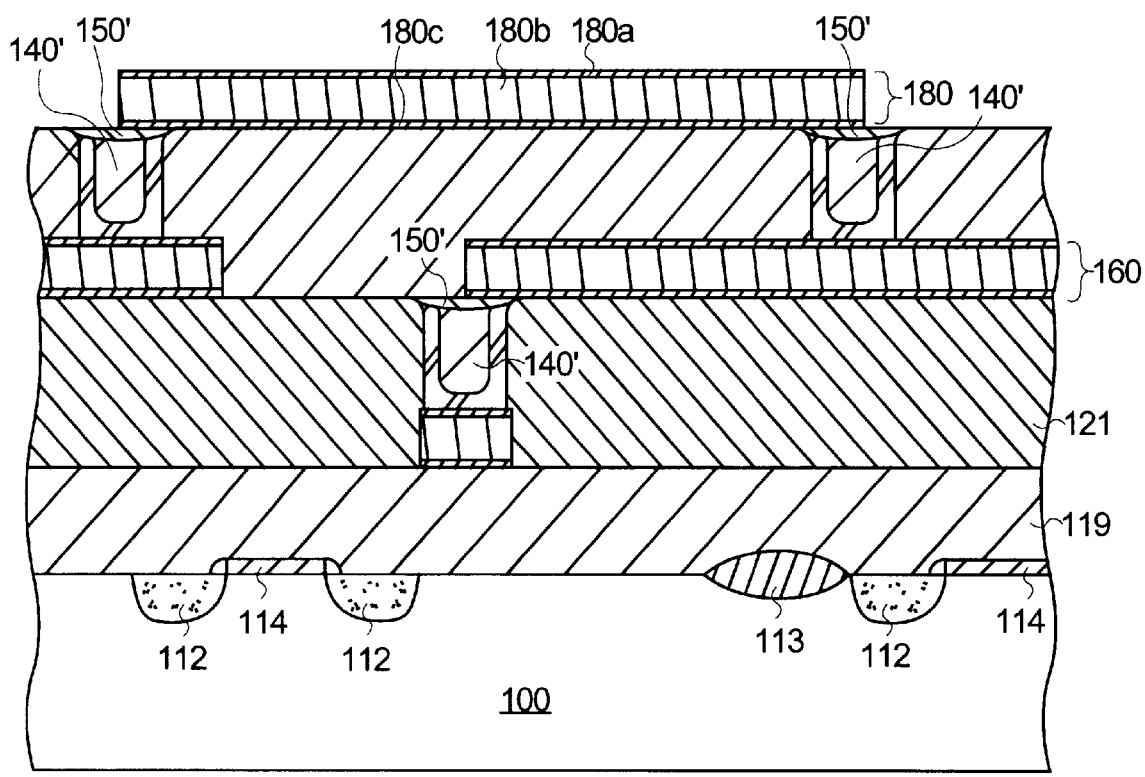
FIG. 10 is a cross-sectional view of an interconnect structure having a second level of interconnect lines and aluminum plugs in accordance with one embodiment of the present invention.

FIG. 10 is a cross-sectional view of an interconnect structure having a second level of interconnect lines and aluminum plugs in accordance with one embodiment of the present invention. In this example, the first metallization layer 160 is interconnected to a second metallization layer 180 by aluminum plugs 140' that are defined through a third low dielectric "K" layer 141. The second metallization layer 180 is also preferably a three layer metallization similar to that of layers 120a/140a, 120b/140b, and 120c/140c. The resulting aluminum plugs used in the interconnect structure are therefore highly resilient to voids resulting from aluminum electromigration. Further, because the electromigration barrier caps 150' formed over the aluminum plugs 140' are substantially resistant to aluminum etching chemistries, any misalignments in the photolithography patterning operations will not cause destructive gaps in the underlying aluminum plugs.

Although the foregoing invention has been described in some detail for purposes of clarity of understanding, it will be apparent that certain changes and modifications may be practiced within the scope of the appended claims. By way of example, although aluminum plug technology has been discussed in great detail, the electromigration barrier properties discussed above would also work well for copper filled plugs with copper interconnects. Accordingly, the present embodiments are to be considered as illustrative and not restrictive, and the invention is not to be limited to the details given herein, but may be modified within the scope and equivalents of the appended claims.

What is claimed is:

1. A method for making a semiconductor interconnect structure having a semiconductor substrate that includes a first low K dielectric material that overlies the semiconductor substrate, the first low K dielectric material supports a patterned first level of metallization, and a second low K dielectric material overlies the first low K dielectric material and the patterned first level of metallization, comprising:

forming at least one via hole through the second low K dielectric material down to the patterned first level of metallization;

depositing a seed layer over the second low K dielectric material and in the at least one via hole;

depositing an aluminum layer over the seed layer that overlies the second low K dielectric material and the at least one via hole such that the at least one via hole is an aluminum filled via hole;

removing the aluminum layer and the seed layer overlying the second low K dielectric material using a chemical mechanical polishing operation that is configured to remove a top portion of the aluminum filled via hole, the removed portion defining a recessed gap of between about 500 angstroms and about 2,500 angstroms at the top portion of the aluminum filled via hole; and depositing an electromigration barrier cap within the recessed gap of the aluminum filled via hole to prevent aluminum atoms from electromigrating out of the aluminum filled via hole during operation.

2. A method for making a semiconductor interconnect structure as recited in claim 1, further comprising:

depositing an interconnect metallization layer over the second low K dielectric material and the electromigration barrier cap; and pattering the interconnect metallization layer such that a line of the patterned interconnect metallization layer is in contact with the electromigration barrier cap of the aluminum filled via hole.

3. A method for making a semiconductor interconnect structure as recited in claim 2, wherein the patterning of the interconnect metallization layer is performed through a plasma etch that does not etch through the electromigration barrier cap of the aluminum filled via hole.

4. A method for making a semiconductor interconnect structure as recited in claim 3, wherein the electromigration barrier cap is a material selected from the group consisting of titanium tungsten (TiW), tungsten (W), and tungsten silicide ($WSi_2$).

5. A method for making a semiconductor interconnect structure as recited in claim 3, wherein the plasma etch implements a $Cl_2/BCL_3$ chemistry having a $Cl_2$ flow rate of about 60 sccms, and a $BCL_3$ flow rate of about 30 sccms.

6. A method for making a semiconductor interconnect structure as recited in claim 1, wherein the first low K dielectric material and the second low K dielectric material is have a K value of between about 2 and 4.

7. A method for making a semiconductor interconnect structure as recited in claim 1, wherein the removing the aluminum layer and the seed layer is performed using a chemical mechanical polishing operation having a slurry chemical including alumina particles, deionized water and an oxidant ($H_2O_2$), the slurry chemical being configured to assist in the formation of the recessed gap at the top portion of the aluminum filled via hole.

* * * * *